United States Patent
Ghoshal et al.

(10) Patent No.: US 8,904,808 B2
(45) Date of Patent: Dec. 9, 2014

(54) HEAT PIPES AND THERMOELECTRIC COOLING DEVICES

(75) Inventors: Uttam Ghoshal, Austin, TX (US); Ayan Guha, Austin, TX (US)

(73) Assignee: Sheetak, Inc., Austin, TX (US)

( * ) Notice: Subject to any disclaimer, the term of this patent is extended or adjusted under 35 U.S.C. 154(b) by 136 days.

(21) Appl. No.: 13/496,291

(22) PCT Filed: Jul. 15, 2010

(86) PCT No.: PCT/US2010/001981
§ 371 (c)(1),
(2), (4) Date: Mar. 15, 2012

(87) PCT Pub. No.: WO2011/008280
PCT Pub. Date: Jan. 20, 2011

(65) Prior Publication Data
US 2012/0192574 A1 Aug. 2, 2012

Related U.S. Application Data

(60) Provisional application No. 61/271,124, filed on Jul. 17, 2009.

(51) Int. Cl.
*F25B 21/02* (2006.01)
*F28D 15/02* (2006.01)
*F28D 15/04* (2006.01)
*H01L 35/30* (2006.01)

(52) U.S. Cl.
CPC ............. *F28D 15/0275* (2013.01); *F25B 21/02* (2013.01); *F28D 15/0266* (2013.01); *F28D 15/04* (2013.01); *H01L 35/30* (2013.01); *F25B 2321/025* (2013.01)
USPC ............................................ 62/3.2; 62/259.2

(58) Field of Classification Search
CPC ............... F25B 21/02; F25B 2321/025; F25D 15/0275; F25D 15/0266; F25D 15/04; F25D 2321/025; H01L 35/30
USPC ................. 62/3.2, 3.3, 3.6, 259.22; 165/80.2, 165/104.21; 361/687, 700
See application file for complete search history.

(56) References Cited

U.S. PATENT DOCUMENTS 3,276,720 A 10/1966 Rich
3,428,496 A 2/1969 Lockwood
(Continued)

FOREIGN PATENT DOCUMENTS

CN 1154467 A 7/1997
CN 1259648 A 7/2000
(Continued)

OTHER PUBLICATIONS

Response to First Office Action dated Aug. 9, 2013 filed on Sep. 30, 2013, corresponding to Chinese Patent Application No. 201080038724.5 filed on Mar. 25, 2013 in Chinese with English translation, 24 pages.
(Continued)

*Primary Examiner* — Mohammad M Ali
(74) *Attorney, Agent, or Firm* — Strasburger & Price LLP

(57) ABSTRACT

In various embodiments of the present invention, a thermoelectric cooling device with a thermoelectric device, heat pipe and a heat sink is provided. The thermoelectric device is connected to a chamber through a metal standoff. The chamber contains a fluid that needs to be cooled. The metal standoff has a shape, e.g. a bevel shape, to minimize heat leakage into the fluid. The heat pipes are preferably connected to the thermoelectric device with a Thermal Interface Material (TIM). In one embodiment, the heat pipes are attached to the thermoelectric device through screws which have an insulating standoff so as to minimize heat leakage into the fluid. In another embodiment of the present invention, two stage thermoelectric cooling devices with multiple heat pipes and common heat sink are provided to cool the fluid.

44 Claims, 15 Drawing Sheets

(56) References Cited

U.S. PATENT DOCUMENTS

| | | | |
|---|---|---|---|
| 3,480,846 A | 11/1969 | Mathes | |
| 3,735,806 A | 5/1973 | Kirkpatrick | |
| 3,826,957 A | 7/1974 | McLaughlin et al. | |
| 3,955,554 A | 5/1976 | Collie | |
| 4,271,681 A | 6/1981 | Schertz | |
| 4,288,854 A | 9/1981 | Burroughs | |
| 4,322,737 A | 3/1982 | Sliwa, Jr. | |
| 4,448,028 A | 5/1984 | Chao | |
| 4,698,541 A | 10/1987 | Bar-Cohen | |
| 4,819,011 A * | 4/1989 | Yokota | 347/223 |
| 4,855,810 A | 8/1989 | Gelb | |
| 5,051,146 A | 9/1991 | Kapolnek | |
| 5,207,674 A * | 5/1993 | Hamilton | 606/20 |
| 5,367,879 A | 11/1994 | Doke | |
| 5,387,849 A | 2/1995 | Sridharan | |
| 5,501,076 A | 3/1996 | Sharp | |
| 5,579,830 A | 12/1996 | Giammaruti | |
| 5,711,155 A | 1/1998 | DeVilbiss | |
| 5,737,923 A | 4/1998 | Gilley | |
| 5,782,094 A | 7/1998 | Freeman | |
| 5,959,341 A | 9/1999 | Tsuno | |
| 6,003,319 A | 12/1999 | Gilley | |
| 6,084,772 A | 7/2000 | Pell | |
| 6,164,076 A * | 12/2000 | Chu et al. | 62/3.7 |
| 6,329,721 B1 | 12/2001 | DiGiacomo | |
| 6,338,251 B1 | 1/2002 | Ghoshal | |
| 6,370,884 B1 | 4/2002 | Kelada | |
| 6,415,612 B1 * | 7/2002 | Pokharna et al. | 62/3.2 |
| 6,583,350 B1 | 6/2003 | Gee | |
| 6,740,600 B2 | 5/2004 | Ghoshal | |
| 6,883,329 B1 | 4/2005 | Martling | |
| 7,032,389 B2 | 4/2006 | Cauchy | |
| 7,131,286 B2 | 11/2006 | Ghoshal et al. | |
| 7,342,169 B2 | 3/2008 | Venkatasubramanian | |
| 7,356,277 B2 * | 4/2008 | Iijima et al. | 399/97 |
| 7,448,222 B2 | 11/2008 | Bormann | |
| 7,483,130 B2 | 1/2009 | Baumberg | |
| 7,763,792 B2 * | 7/2010 | Sharp et al. | 136/224 |
| 8,075,150 B2 * | 12/2011 | Maruyama | 362/97.1 |
| 8,168,879 B2 | 5/2012 | Chen | |
| 2003/0029174 A1 | 2/2003 | Lee | |
| 2003/0041892 A1 | 3/2003 | Fleurial | |
| 2004/0173257 A1 | 9/2004 | Rogers | |
| 2005/0051208 A1 | 3/2005 | Mount | |
| 2005/0126184 A1 | 6/2005 | Cauchy | |
| 2005/0150535 A1 | 7/2005 | Samavedam | |
| 2005/0150536 A1 | 7/2005 | Ngai | |
| 2005/0150537 A1 | 7/2005 | Ghoshal | |
| 2005/0150539 A1 | 7/2005 | Ghoshal | |
| 2005/0210884 A1 | 9/2005 | Tuskiewicz | |
| 2005/0257532 A1 * | 11/2005 | Ikeda et al. | 62/3.7 |
| 2005/0274120 A1 | 12/2005 | Quisenberry et al. | |
| 2006/0011776 A1 | 1/2006 | Maurer | |
| 2006/0076046 A1 | 4/2006 | Ghoshal | |
| 2006/0082971 A1 * | 4/2006 | Artman et al. | 361/700 |
| 2006/0117761 A1 | 6/2006 | Bormann | |
| 2006/0137360 A1 | 6/2006 | Ghoshal | |
| 2006/0255341 A1 | 11/2006 | Pinnington | |
| 2006/0266043 A1 | 11/2006 | Jerome | |
| 2006/0289052 A1 | 12/2006 | OQuinn | |
| 2007/0090892 A1 | 4/2007 | Larson | |
| 2007/0107764 A1 | 5/2007 | Kanatzidis | |
| 2007/0137687 A1 | 6/2007 | Tanielian | |
| 2007/0221266 A1 | 9/2007 | Davies | |
| 2007/0251569 A1 | 11/2007 | Shan | |
| 2007/0261730 A1 | 11/2007 | Seker et al. | |
| 2007/0289622 A1 | 12/2007 | Hecht | |
| 2008/0020946 A1 | 1/2008 | Venkatasubramanian | |
| 2008/0035312 A1 | 2/2008 | Filippone | |
| 2008/0053509 A1 | 3/2008 | Flitsch | |
| 2008/0083446 A1 | 4/2008 | Chakraborty | |
| 2008/0117761 A1 | 5/2008 | Hwang | |
| 2008/0121263 A1 | 5/2008 | Schutte | |
| 2008/0173343 A1 | 7/2008 | Kanno | |
| 2008/0184710 A1 | 8/2008 | DeVilbiss | |
| 2008/0289677 A1 | 11/2008 | Bell | |
| 2008/0295879 A1 | 12/2008 | Atanackovic | |
| 2009/0049845 A1 | 2/2009 | McStravick | |
| 2009/0109621 A1 | 4/2009 | Cheng | |
| 2009/0322221 A1 | 12/2009 | Makansi | |
| 2010/0108117 A1 | 5/2010 | Hamano | |
| 2010/0126555 A1 | 5/2010 | Maxton | |
| 2010/0154854 A1 | 6/2010 | Lee | |
| 2010/0186794 A1 | 7/2010 | Chen | |
| 2010/0193001 A1 | 8/2010 | Hirono | |
| 2010/0230071 A1 | 9/2010 | Slater | |
| 2010/0313576 A1 | 12/2010 | Goenka | |
| 2011/0000224 A1 | 1/2011 | Ghoshal | |
| 2011/0016886 A1 | 1/2011 | Ghoshal | |
| 2011/0100410 A1 | 5/2011 | Takahashi | |
| 2011/0107765 A1 | 5/2011 | Valeev | |
| 2012/0048322 A1 | 3/2012 | Ghoshal | |
| 2012/0085316 A1 | 4/2012 | Chen | |

FOREIGN PATENT DOCUMENTS

| | | |
|---|---|---|
| CN | 1478307 A | 2/2004 |
| CN | 1680766 A | 10/2005 |
| CN | 1845316 A | 10/2006 |
| JP | H181481 A | 5/1989 |
| JP | 2003343986 A | 12/2003 |
| JP | 200471969 A | 3/2004 |
| JP | 2007100992 A | 4/2007 |
| JP | 2007178043 A | 7/2007 |
| WO | 0247177 A2 | 6/2002 |
| WO | 2006119305 A2 | 11/2006 |
| WO | 2009111008 A1 | 9/2009 |
| WO | 2010012718 A1 | 4/2010 |
| WO | 2011008280 A1 | 1/2011 |
| WO | 2011044115 A2 | 4/2011 |
| WO | 2012038917 A2 | 3/2012 |

OTHER PUBLICATIONS

Second Office Action dated Apr. 12, 2014, corresponding to Chinese Patent Application No. 201080038724.5 filed Jul. 15, 2010 in Chinese with English translation, 27 pages.

Response to Second Office Action dated Apr. 12, 2014 filed on May 26, 2014, corresponding to Chinese Patent Application No. 201080038724.5 filed Jul. 15, 2010 in Chinese with English translation, 21 pages.

Patent Office of the People's Republic of China Search Report dated Jan. 20, 2014, corresponding to Chinese Patent Application No. 201080038724.5 filed Jul. 15, 2010 in Chinese with English translation, 5 pages.

First Office Action dated Mar. 25, 2013, corresponding to Chinese Patent Application No. 201080038724.5 filed Jul. 15, 2010 in Chinese, 13 pages.

Extended European Search Report for European Application No. EP10800160 dated Jun. 4, 2014 (7 pages).

N.D. Arora and J.R. Hauser. Department of Electrical Engineering, North Carolina State University, "Temperature Dependence of Silcon Solar Cell Characteristics", Aug. 12, 1981.published in Solar Energy Materials 6 (1982), pp. 151-158 (8 pages).

Narayanaswamy, A. and Chen, Gang: Thermal emission control with one-dimensional metallodielectric photonic crystals; Physical Review B 70, 125101—Published Sep. 2, 2004; Entire document; Retrieved on Oct. 7, 2013 from the Internet <URL:http://prb.aps.org/abstract/PRB/v70/i12/s1251 01 > <DOI: 10.11 03/PhysRevB.70, 1251 01 >; (3 pages).

Newport Corporation; "Heat Control Filters" (2001); Webpage retrieved on Apr. 5, 2013; URL:http://www.newport.com/Heat-Control-Filters/141134/1033/info.aspx (1 page).

Notification of First Office Action from the State Intellectual Property Office of People's Republic of China dated Mar. 28, 2012 corresponding to Chinese Patent Application No. 200980107943.1, with English translation (34 pages).

Notification of First Office from the State Intellectual Property Office of People's Republic of China dated Mar. 25, 2013 corresponding to Chinese Patent Application No. 201080038724.5, with English translation (39 pages).

(56) References Cited

OTHER PUBLICATIONS

Notification of First Office from the State Intellectual Property Office of People's Republic of China dated Nov. 27, 2012 corresponding to Chinese Patent Application No. 200980109712.4, with English translation (21 pages).
Notification of Reexamination from the State Intellectual Property Office of the People's Republic of China dated Jun. 19, 2014 corresponding to Chinese Patent Application No. 200980109712.4 and English translation of same (15 pages).
Notification of the First Office Action from the State Intellectual Property Office of People's of China dated Dec. 22, 2011 corresponding to Chinese Patent Application No. 200980109712.4; with English translation (11 pages).
Notification of the Second Office Action from the State Intellectual Property Office of People's Republic of China dated Feb. 8, 2013 corresponding to Chinese Patent Application No. 200980107943.1; with English translation (9 pages).
Notification of the Second Office Action from the State Intellectual Property Office of People's Republic of China dated Jan. 28, 2014 corresponding to Chinese Patent Application No. 201080038724.5; Attorneys: Wu, Huanfang and Tian, Junfeng, with English translation (29 pages).
Notification of Third Office from the State Intellectual Property Office of People's Republic of China dated Sep. 4, 2014 corresponding to Chinese Patent Application No. 201080038724,5, with English translation (10 pages).
PCT International Preliminary Report on Patentability for International Application No. PCT/US09/01348 dated Sep. 7, 2010 (6 pages).
PCT International Preliminary Report on Patentability for International Application No. PCT/US09/01542 dated Sep. 21, 2010 (6 pages).
PCT International Preliminary Report on Patentability for International Application No. PCT/US11/00061 dated Jul. 16, 2013 (10 pages).
PCT International Preliminary Report on Patentability for International Application No. PCT/US12/60498 dated Apr. 22, 2014 (7 pages).
PCT International Search Report for International Application No. PCT/US09/01348 dated Apr. 29, 2009 (2 pages).
PCT International Search Report for International Application No. PCT/US09/01542 dated May 5, 2009 (2 pages).
PCT International Search Report for International Application No. PCT/US10/01981 dated Sep. 15, 2010 (2 pages).
PCT International Search Report for International Application No. PCT/US10/02464 dated Nov. 5, 2010 (2 pages).
PCT International Search Report for international Application No. PCT/US11/00061 dated May 19, 2011 (4 pages).
PCT International Search Report for International Application No. PCT/US11/01914 dated Apr. 2, 2012 (2 pages).
PCT International Search Report for International Application No. PCT/US12/36252 dated Aug. 7, 2012 (3 pages).
PCT International Search Report for International Application No. PCT/US13/35986 dated Jul. 28, 2014 (5 pages).
PCT International Search Report for International Application No. PCT/US2012/060498 dated Jan. 2, 2013 (2 pages).
PCT International Search Report for International Application No. PCT/US2013/40097 dated Sep. 10, 2013 (2 pages).
PCT Written Opinion of the International Search Authority for International Application No. PCT/US13/35986 dated Jul. 29, 2014 (11 pages).
PCT Written Opinion of the International Search Authority for International Application No. PCT/US2009/001542 dated May 5, 2009 (5 pages).
PCT Written Opinion of the International Searching Authority for International Application No. PCT/US09/01348 dated Apr. 29, 2009 (5 pages).
PCT Written Opinion of the International Searching Authority for International Application No. PCT/US09/001542 dated May 5, 2009 (5 pages).
PCT Written Opinion of the International Searching Authority for International Application No. PCT/US10/01981 dated Sep. 15, 2010 (7 pages).
PCT Written Opinion of the International Searching Authority for International Application No. PCT/US10/02464 dated Nov. 5, 2010 (5 pages).
PCT Written Opinion of the International Searching Authority for International Application No. PCT/US11/00061 dated May 19, 2011 (9 pages)
PCT Written Opinion of the International Searching Authority for International Application No. PCT/US11/01914 dated Apr. 2, 2012 (8 pages).
PCT Written Opinion of the International Searching Authority for International Application No. PCT/US12/36252 dated Aug. 7, 2012 (5 pages)E-mail FromvbTabE-mail TovbTabDocument NamevbTabDoc #vbTabEdit DatevbTabFinal DocumentvbTabTang. JohnvbTabTurner, Clydenevb Tab FW; Your OHT Quote/ STRASBURGER/Fwd. Translation of Chinese Patent Related documents.
PCT Written Opinion of the International Searching Authority for International Application No. PCT/US12/60498 dated Jan. 2, 2013 (6 pages).
PCT Written Opinion of the International Searching Authority for International Application No. PCT/US13/40097 dated Sep. 10, 2013 (28 pages).
Response to Notification of the First Office Action from the State Intellectual Property Office of People's Republic of China dated Oct. 12, 2012 corresponding to Chinese Patent Application No. 200980107943.1; with English translation (21 pages).
Response to Notification of the First Office Action from the State Intellectual Property Office of People's Republic of China dated Sep. 30, 2013 corresponding to Chinese Patent Application No. 201080038724.5; with English translalion (18 pages).
Response to Notification of the Second Office Action from the State Intellectual Property Office of People's Republic of China dated Apr. 18, 2014 corresponding to Chinese Patent Application No. 200980107943.1; with English translation (17 pages).
International Search Report from the International Searching Authority Korea (US) mailed Sep. 15, 2010 corresponding to U.S. Appl. No. 13/496,291 (published as US2012-0192574 A1 on Aug. 2, 2012) (2 pages).

\* cited by examiner

HEAT PIPES AND THERMOELECTRIC COOLING DEVICES

BACKGROUND

The present invention relates to thermoelectric cooling systems. More specifically, the present invention relates to thermoelectric cooling systems with heat pipes and heat sinks.

Thermoelectric cooling systems are reliable, lightweight, and an environment-friendly alternative to traditional vapor compression systems. For cooling purposes, conventional thermoelectric cooling systems use one or more thermoelectric devices in conjunction with a DC power source. While cooling a chamber, the thermoelectric devices transfer heat from a cold side of the thermoelectric devices to a hot side of the thermoelectric devices.

When the thermoelectric cooling systems are switched off, heat flows through the thermoelectric devices from the hot side to the cold side, thereby warming the chamber to the ambient temperature.

As a result, the conventional thermoelectric cooling systems need to be switched on for long intervals of time to maintain the chamber at a desired low temperature. This increases power consumption. Thus, the conventional thermoelectric cooling systems are inefficient for cold storage purposes.

Therefore, there is a need for using heat pipes to efficiently regulate the heat flow through the thermoelectric devices.

Although heat pipes based on vapor diodes have been developed previously, there is room for improvement with respect to their structure and their attachment to the thermoelectric devices. Thus a need persists for further contributions in this area of technology.

SUMMARY

An object of the present invention is to provide a thermoelectric cooling device and heat pipes that can efficiently regulate heat flow through a thermoelectric device.

To meet the objective mentioned above, the present invention provides a thermoelectric device connected to a chamber. The chamber contains a fluid to be cooled. One or more heat pipes are connected to the thermoelectric device to control the heat flow through the thermoelectric device. In an embodiment of the present invention, the heat pipes are a type of thermal diode.

In an embodiment of the present invention, an assembly of a plurality of heat pipes is provided. At least one of the heat pipes comprises a working fluid, an adiabatic section, and a condenser section. The condenser section is connected to a heat sink that has fins to assist dissipation of heat. The assembly further comprises an evaporation section common to at least two of the plurality of heat pipes.

When the thermoelectric device is switched on, it extracts heat from the fluid and transfers the heat from a cold side of the thermoelectric device to a hot side of the thermoelectric device. The heat pipes dissipate the heat to the ambient. When the thermoelectric device is switched off, the heat pipes act as an insulator and prevent conduction of heat from the ambient to the fluid.

In another embodiment of the present invention, an assembly and details of a mechanism for attaching the heat pipes to the thermoelectric device and to the chamber is provided.

The thermoelectric device is connected to a cold sink through a metal standoff. The cold sink facilitates transfer of heat from the fluid to the thermoelectric device. Typical examples of the metal standoff include, but are not limited to thermally conducting metals such as aluminum and copper. The metal standoff has a shape, e.g. bevel shape, which minimizes heat leakage into the metal standoff. The heat pipes are attached to the thermoelectric device through a Thermal Interface Material (TIM). The heat pipes are also attached to the thermoelectric device through screws which have an insulating standoff and grommets to minimize heat leakage.

In another embodiment of the present invention, a thermoelectric cooling device with a two stage thermoelectric device, multiple heat pipes, and a common heat sink is provided.

BRIEF DESCRIPTION OF THE DRAWINGS

The preferred embodiments of the present invention will hereinafter be described in conjunction with the appended drawings that are provided to illustrate, and not to limit the invention, wherein like designations denote like elements, and in which.

DETAILED DESCRIPTION OF THE INVENTION

Before describing the embodiments in detail, in accordance with the present invention, it should be observed that these embodiments reside primarily in thermoelectric cooling systems with heat pipes. Accordingly, the system components have been represented to show only those specific details that are pertinent for an understanding of the embodiments of the present invention, and not the details that will be apparent to those with ordinary skill in the art.

Figure 1:
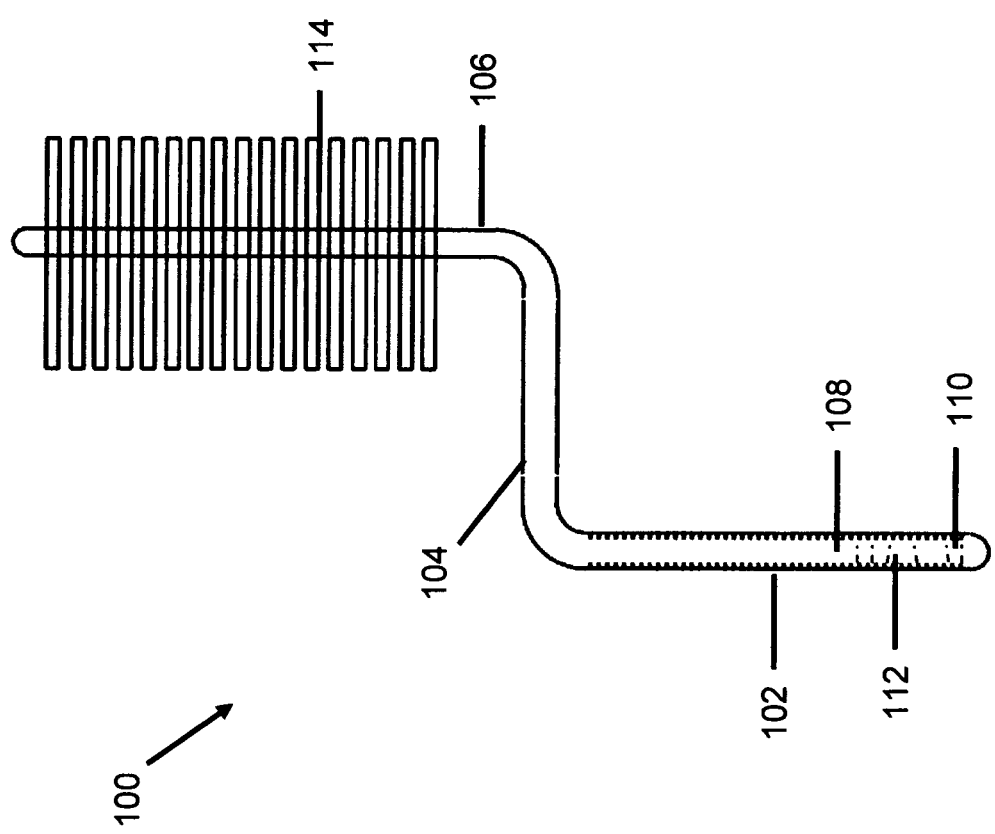
FIG. 1 illustrates a cross-sectional view of a heat pipe, in accordance with an embodiment of the invention.

FIG. 1 illustrates a cross-sectional view of a heat pipe 100, in accordance with an embodiment of the invention.

Heat pipe 100 comprises three sections—an evaporation section 102, an adiabatic section 104, and a condenser section 106. Evaporation section 102 includes a chamber 108 and a fluid reservoir 110 that contains a working fluid 112. In an embodiment of the present invention, evaporation section 102 is a sintered surface, a grooved surface, or a meshed surface that enhances evaporation.

Working fluid 112 is selected on the basis of the desired heat flow through heat pipe 100. If the heat flow through heat pipe 100 is high, water is chosen as working fluid 112. If the heat flow through heat pipe 100 is low, any other fluid with lower heat of vaporization than water is chosen as working fluid 112. Examples of fluids with low heat of vaporization include, but are not limited to, ammonia, ethanol, acetone, fluorocarbons such as Freon, mixtures of water and ethyl alcohol, and mixtures of water and ammonia.

Adiabatic section 104 of heat pipe 100 is thermally insulating. In an embodiment of the present invention, adiabatic section 104 is made of a material chosen from, but not limited to, nickel, titanium, stainless steel, macor, glass, or other ceramics to decrease the conductivity of adiabatic section 104.

Condenser section 106 is connected to a heat sink 114. Heat sink 114 has fins that facilitate transfer of heat to the ambient. Heat pipe 100 acts like a space transformer that extracts heat from a small area, which is essentially the footprint of a thermoelectric device (explained in conjunction with FIG. 4) and rejects the heat over a large area comprising heat sink 114.

Heat pipe 100 has a directional dependency of heat flow and it acts as a thermal diode. It allows heat flow from evaporation section 102 to condenser section 106 and prevents heat flow from condenser section 106 to evaporation section 102.

Evaporation section 102 is connected to a surface from which heat has to be extracted. In an embodiment of the present invention, evaporation section 102 is connected to the thermoelectric device.

When the thermoelectric device is switched on, the heat rejected by the thermoelectric device is transferred to working fluid 112. Working fluid 112 evaporates by absorbing heat and forms vapor in chamber 108. The vapor reaches condenser section 106 through adiabatic section 104 and loses heat to condenser section 106 to form droplets. Thereafter, condenser section 106 transfers the heat to the ambient through heat sink 114. The droplets then return to evaporation section 102 and replenish fluid reservoir 110.

When the thermoelectric device is switched off, a cold side of the thermoelectric device reduces the temperature of a hot side to a temperature lower than the ambient temperature. Since no heat is rejected from the thermoelectric device, working fluid 112 remains in a liquid state in evaporation section 102. Further, adiabatic section 104 prevents heat flow from the ambient to evaporation section 102. Hence, heat transfer from the ambient to the thermoelectric device is minimized.

Figure 2:
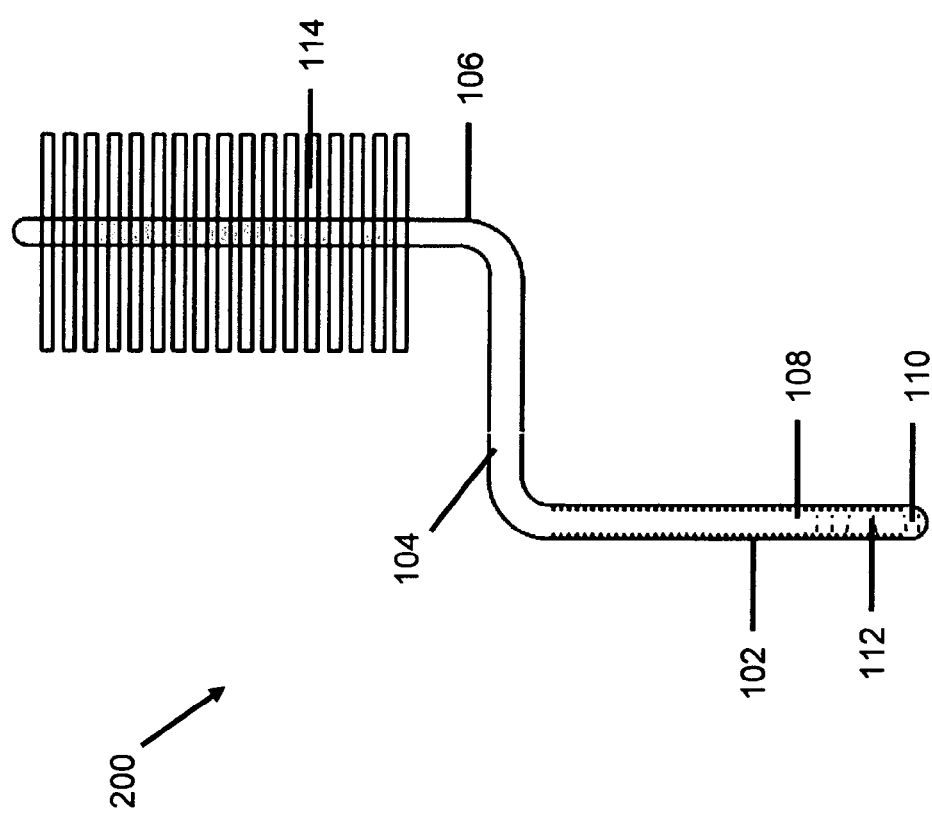
FIG. 2 illustrates a cross-sectional view of a heat pipe, in accordance with another embodiment of the invention.

FIG. 2 illustrates a cross-sectional view of a heat pipe 200, in accordance with another embodiment of the invention.

Heat pipe 200 contains the elements mentioned in conjunction with FIG. 1. Heat pipe 200 is different from heat pipe 100 with respect to the material of adiabatic section 104 and condenser section 106. In an embodiment of the present invention adiabatic section 104 and condenser section 106 of heat pipe 200 comprise a single tube made of nickel, aluminum, or stainless steel. In heat pipe 200, the single tube that forms adiabatic section 104 and condenser section 106 is attached to evaporation section 102 at a single brazed solder joint. This makes heat pipe 200 easier to manufacture as compared to heat pipe 100, where adiabatic section 104 is joined both to condenser section 106 and evaporation section 102.

Figure 3:
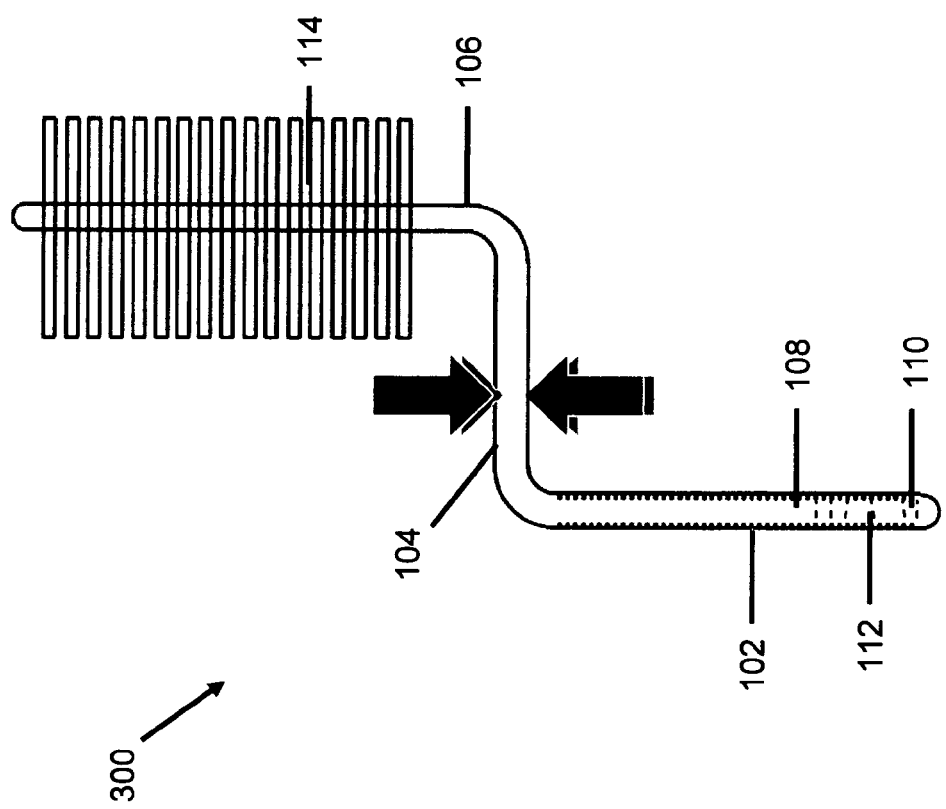
FIG. 3 illustrates a cross-sectional view of a heat pipe, in accordance with yet another embodiment of the invention.

FIG. 3 illustrates a cross-sectional view of a heat pipe 300, in accordance with yet another embodiment of the invention.

Heat pipe 300 contains the elements mentioned in conjunction with FIG. 1. Heat pipe 300 is different from heat pipe 100 with respect to the material of adiabatic section 104. Adiabatic section 104 of heat pipe 300 is made by externally etching a copper wall (as illustrated by the arrows). The thickness of the copper wall is reduced to decrease the thermal conduction of adiabatic section 104. Since a thin copper wall is mechanically weak, the copper wall is reinforced with an insulating epoxy material or any other material that is insulating as well as mechanically strong.

In this embodiment of the present invention, a single tube forms evaporation section 102, adiabatic section 104, and condenser section 106 of heat pipe 300, and adiabatic section 104 is created by reducing the wall thickness. Therefore, the simple design makes heat pipe 300 easy to manufacture.

Figure 4:
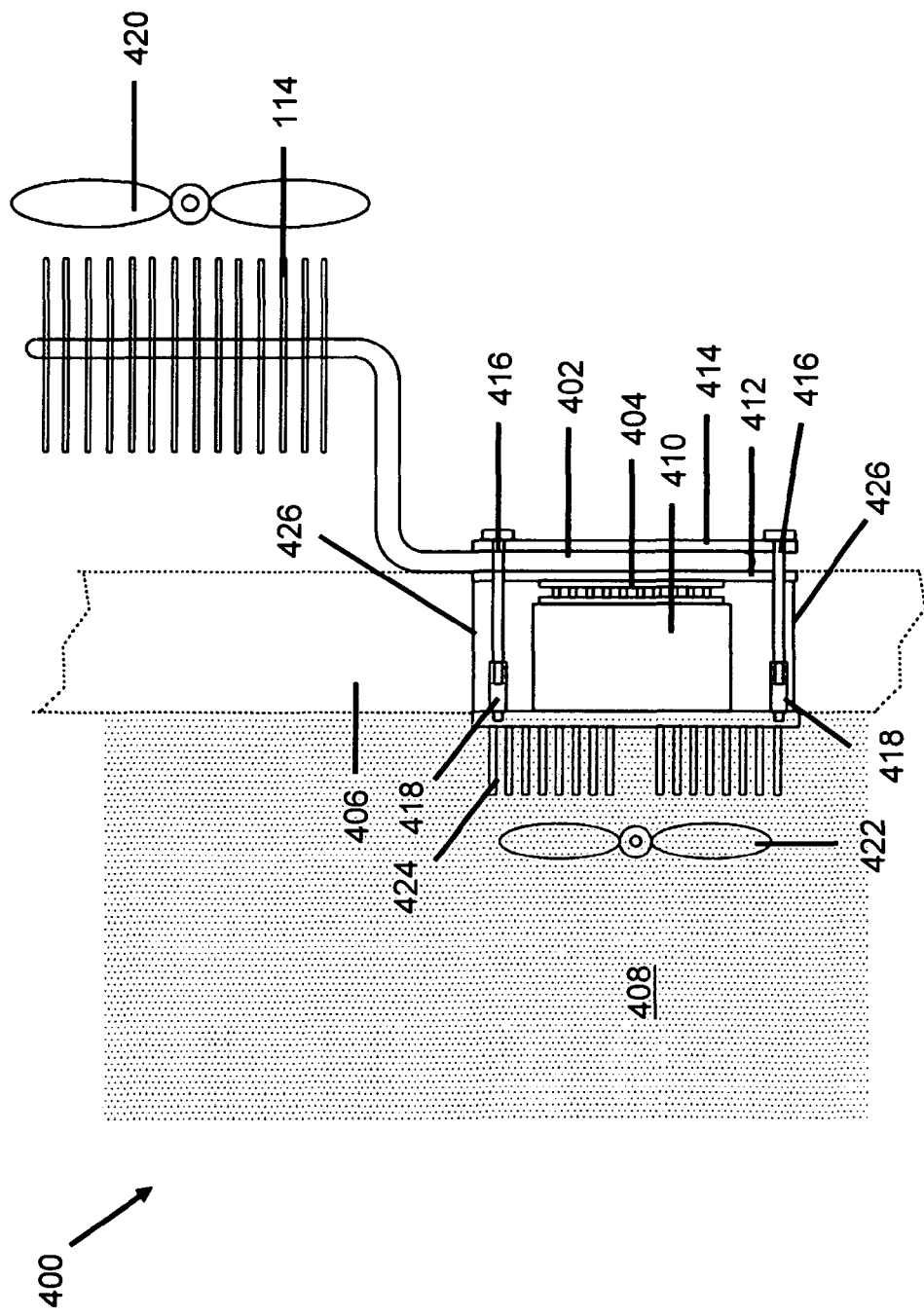
FIG. 4 illustrates a cross-sectional view of a thermoelectric cooling device, in accordance with an embodiment of the invention.

FIG. 4 illustrates a cross-sectional view of a thermoelectric cooling device 400, in accordance with an embodiment of the invention.

Thermoelectric cooling device 400 contains a heat pipe 402 connected to a hot side of a thermoelectric device 404. Heat pipe 402 is connected to thermoelectric device 404 through a Thermal Interface Material (TIM) (not shown in the figure). In another embodiment of the invention, heat pipe 402 is connected to thermoelectric device 404 through low temperature solder or thermally conducting epoxy (described in conjunction with FIG. 14).

Thermoelectric device 404 is connected to a chamber 406 (only one side of chamber 406 is shown to focus on a wall of chamber 406). Chamber 406 contains a fluid 408 that needs to be cooled. In an embodiment of the present invention, chamber 406 is the cooling chamber of a refrigerator. A metal standoff 410 connects a cold side of thermoelectric device 404 to chamber 406. In an embodiment of the present invention metal standoff 410 is made of aluminum.

A first plate 412, a second plate 414, and screws 416 hold heat pipe 402 to the hot side of thermoelectric device 404 and chamber 406. Heat pipe 402 is soldered to first plate 412, which is made of copper or copper alloy. Since first plate 412 is prone to buckling under compressive forces, second plate 414 is used to press heat pipe 402 to the hot side of thermoelectric device 404. Second plate 414 is made of a hard material that provides strength to second plate 414. Screws 416 are made of a metal and have an insulating standoff 418 that prevents the heat flow from the hot side of thermoelectric device 404 to fluid 408. Insulating standoff 418 can be made of materials such as plastics, ceramics, or other thermally insulating materials.

In another embodiment of the present invention screws 416 are entirely made up of an insulating material such as ceramic or hard plastic material to prevent the heat flow from the hot side of thermoelectric device 404 to fluid 408.

An insulating boundary 426 encloses components including thermoelectric device 404, metal standoff 410, and screws

416. Insulating boundary 426 is filled with an insulating material such as styrofoam, aerogel, and polyurethane foam.

Heat pipe 402 is connected to a heat sink 114. Further, a heat sink fan 420 is present proximal to heat sink 114. Heat sink fan 420 facilitates transfer of heat from heat sink 114 to the ambient.

When thermoelectric device 404 is switched on, it cools fluid 408 through a cold sink 424 that comprises an extended fin structure. The hot side of thermoelectric device 404 is at a higher temperature than that of heat sink 114. Heat extracted by thermoelectric device 404 from fluid 408 is conducted to heat sink 114 through heat pipe 402.

Chamber 406 has a cold fan 422 that helps in transferring heat from fluid 408 to thermoelectric device 404. Further, cold fan 422 helps in maintaining a uniform temperature within chamber 406.

When thermoelectric device 404 is switched off, the temperature of the hot side of thermoelectric device 404 becomes close to the temperature of fluid 408, which is at a lower temperature than that of the ambient. However, in this state, working fluid 112 of heat pipe 402 is present in a condensed state in fluid reservoir 110 (explained in conjunction with FIG. 1). Thus, working fluid 112 is not in contact with heat sink 114. Therefore reverse flow of heat from heat sink 114 to fluid 408 through working fluid 112 is prevented. Moreover, adiabatic section 104 (explained in conjunction with FIG. 1) of heat pipe 402 thermally isolates heat sink 114 from the condensed working fluid 112. Further, this prevents backflow of heat from the ambient to fluid 408.

Figure 5:
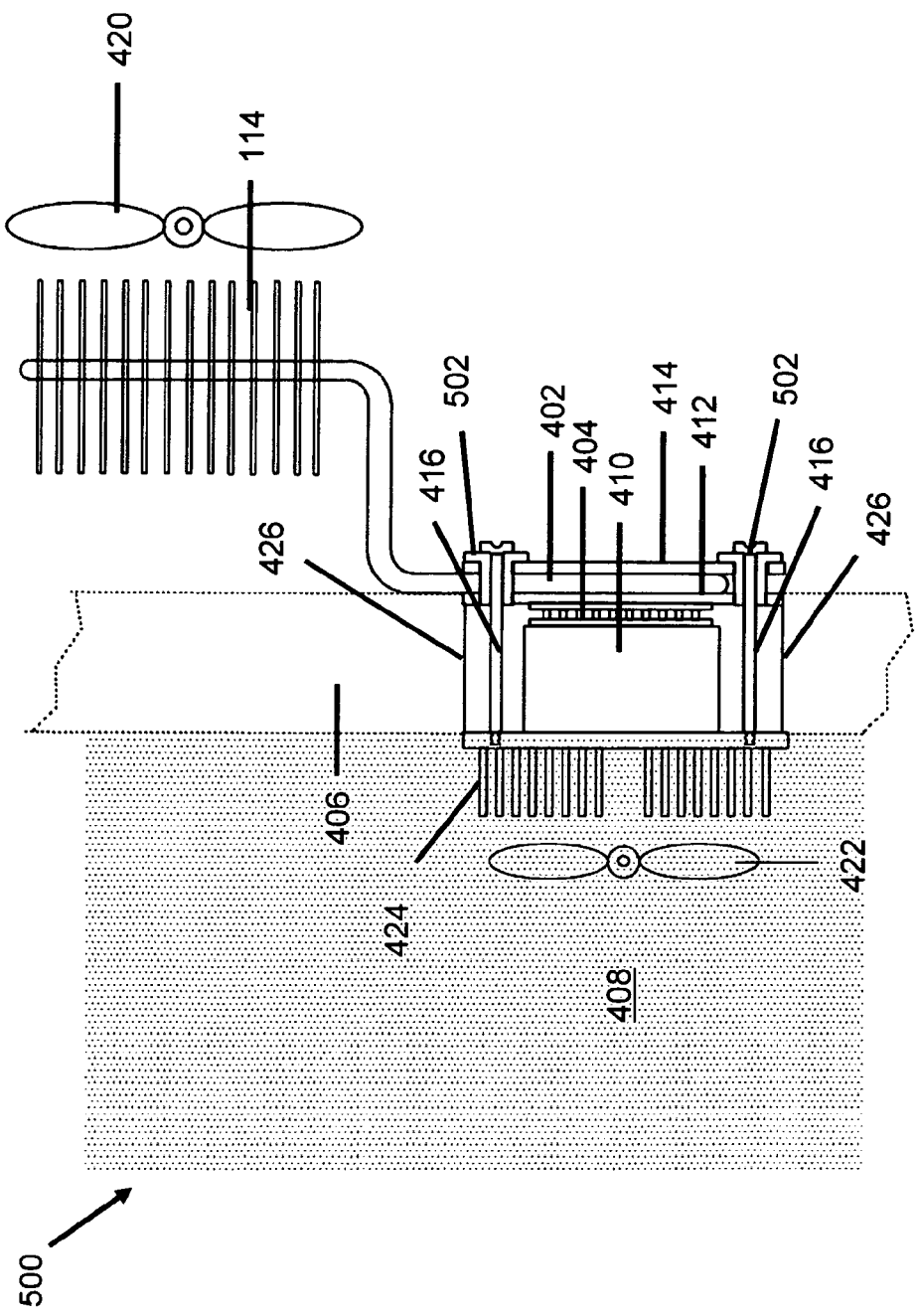
FIG. 5 illustrates a cross-sectional view of a thermoelectric cooling device, in accordance with another embodiment of the invention.

FIG. 5 illustrates a cross-sectional view of a thermoelectric cooling device 500, in accordance with another embodiment of the invention.

Apart from the elements mentioned in conjunction with FIG. 4, thermoelectric cooling device 500 has a different arrangement of attaching heat pipe 402 to thermoelectric device 404 and chamber 406. In thermoelectric cooling device 500, screws 416 have an insulating standoff 502 present at the hot side of thermoelectric cooling device 500.

Figure 6:
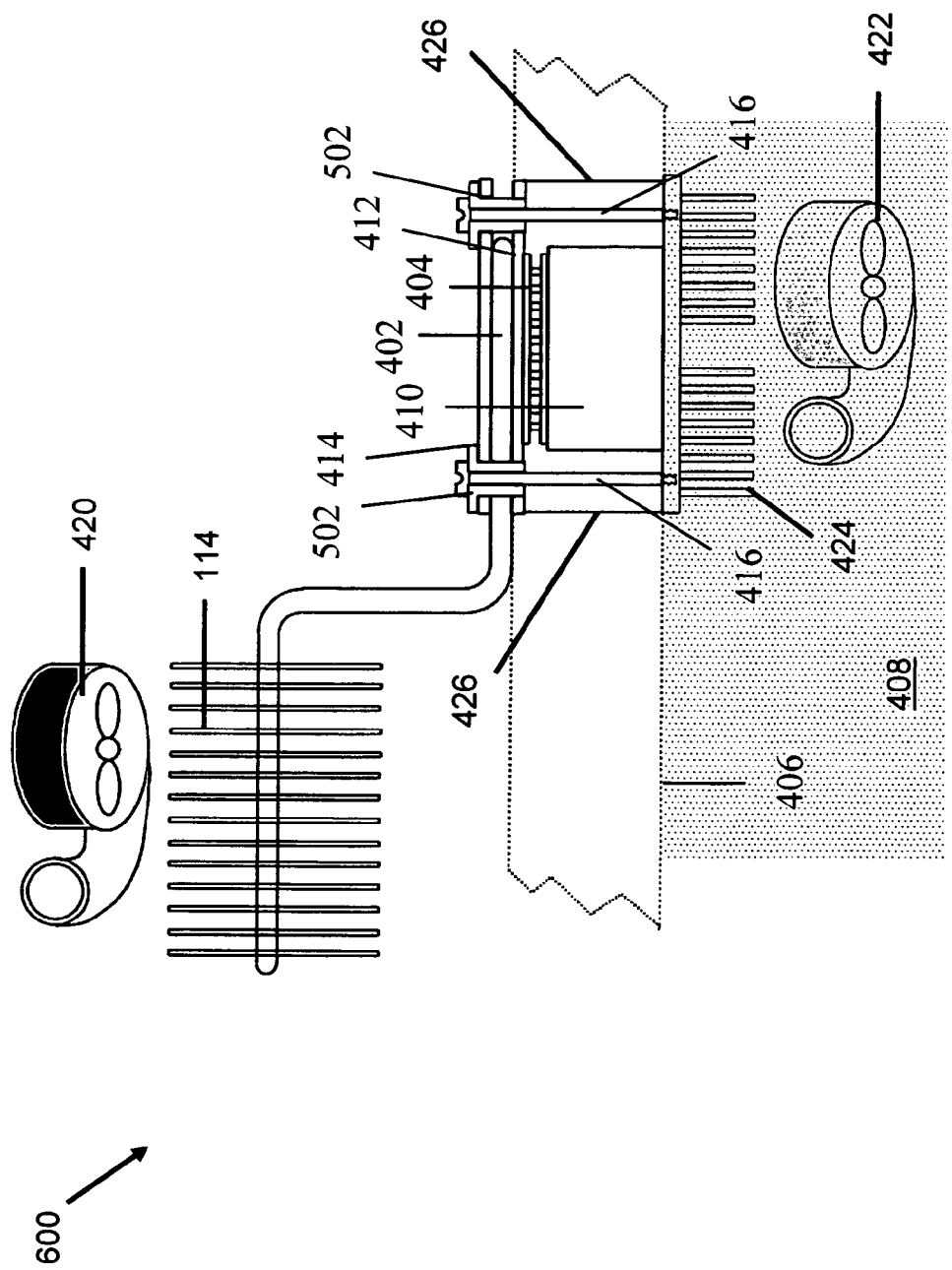
FIG. 6 illustrates a cross-sectional view of a thermoelectric cooling device, in accordance with yet another embodiment of the invention.

FIG. 6 illustrates a cross-sectional view of a thermoelectric cooling device 600, in accordance with another embodiment of the present invention.

Thermoelectric cooling device 600 has all the elements mentioned in conjunction with FIG. 5. Thermoelectric cooling device 600 represents an arrangement where thermoelectric device 404 is placed on the top of chamber 406. In this embodiment, heat pipe 402 transfers heat horizontally from chamber 406 to the ambient. This embodiment of the present invention is suitable for use in a portable cooler box, where thermoelectric cooling device 600 can be attached to the lid of the portable cooler box. Heat sink fan 420 and cold fan 422 are blower fans that move the air through the fins of heat sink 114 and cold sink 424, respectively.

Figure 7:
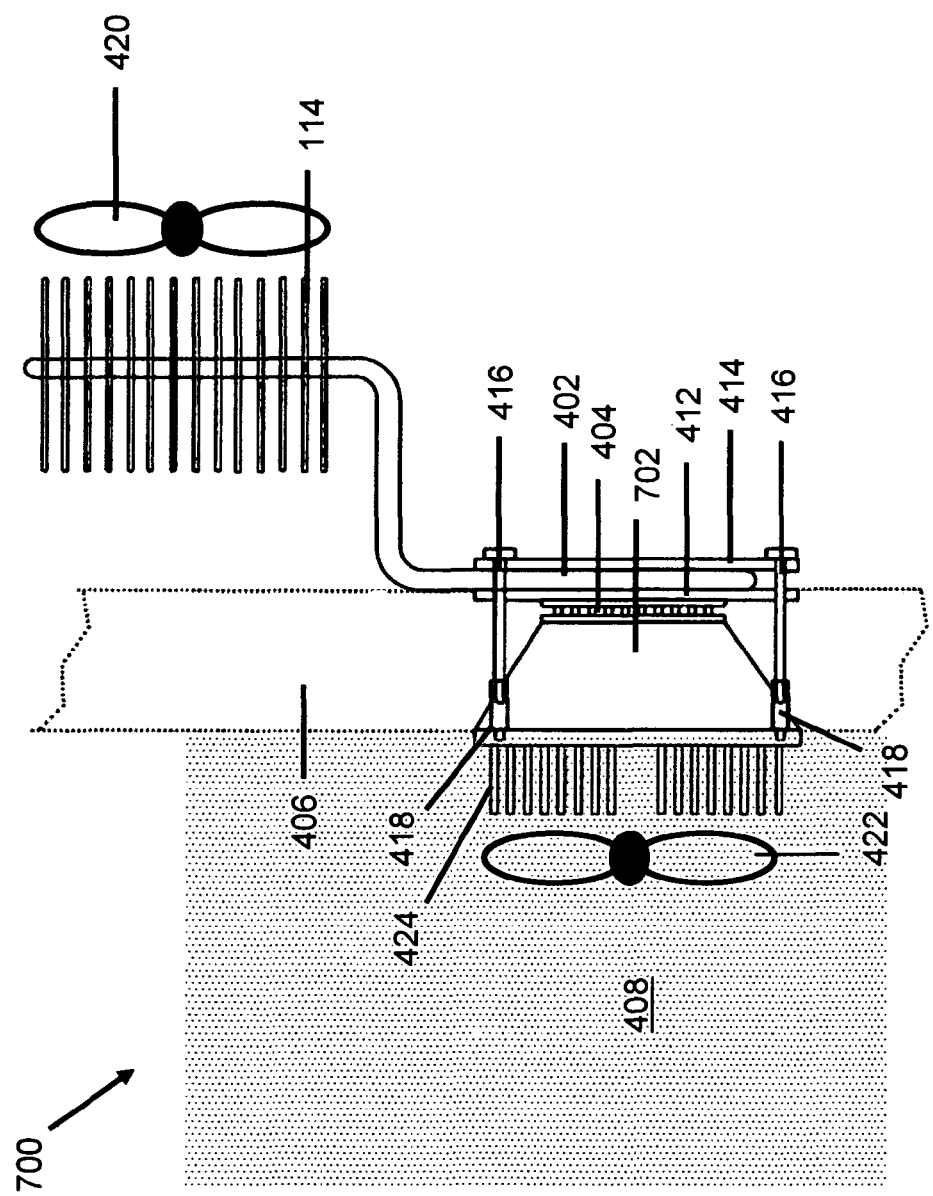
FIG. 7 illustrates a cross-sectional view of a thermoelectric cooling device, in accordance with yet another embodiment of the invention.

FIG. 7 illustrates a cross-sectional view of a thermoelectric cooling device 700, in accordance with yet another embodiment of the present invention.

Thermoelectric cooling device 700 has the elements mentioned in conjunction with FIG. 4. Thermoelectric cooling device 700 contains a metal standoff 702 that has a bevel shape. The bevel shape enables metal standoff 702 to focus heat from cold sink 424, which is an extended fin structure, to the cold side of thermoelectric device 404 without significant temperature drop across the bevel. This results in better heat spreading and reduction in parasitic heat leakage from the hot side of thermoelectric device 404 and first plate 412 into chamber 406.

Figure 8:
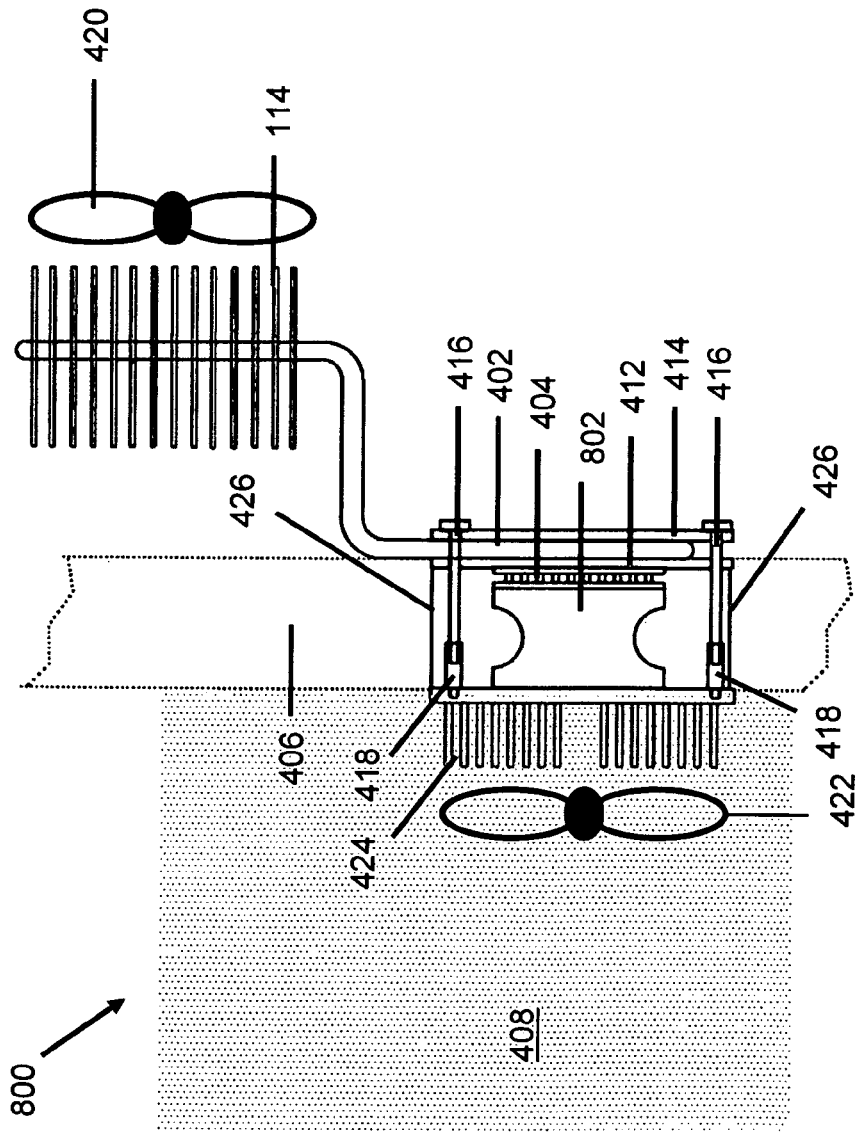
FIG. 8 illustrates a cross-sectional view of a thermoelectric cooling device, in accordance with yet another embodiment of the invention.

FIG. 8 illustrates a cross-sectional view of a thermoelectric cooling device 800, in accordance with yet another embodiment of the invention.

Thermoelectric cooling device 800 has the elements mentioned in conjunction with FIG. 4. Thermoelectric cooling device 800 contains a metal standoff 802 that has a higher cross-sectional area at the ends than at its centre. This shape results in reduction in leakage of heat into chamber 406.

Figure 9:
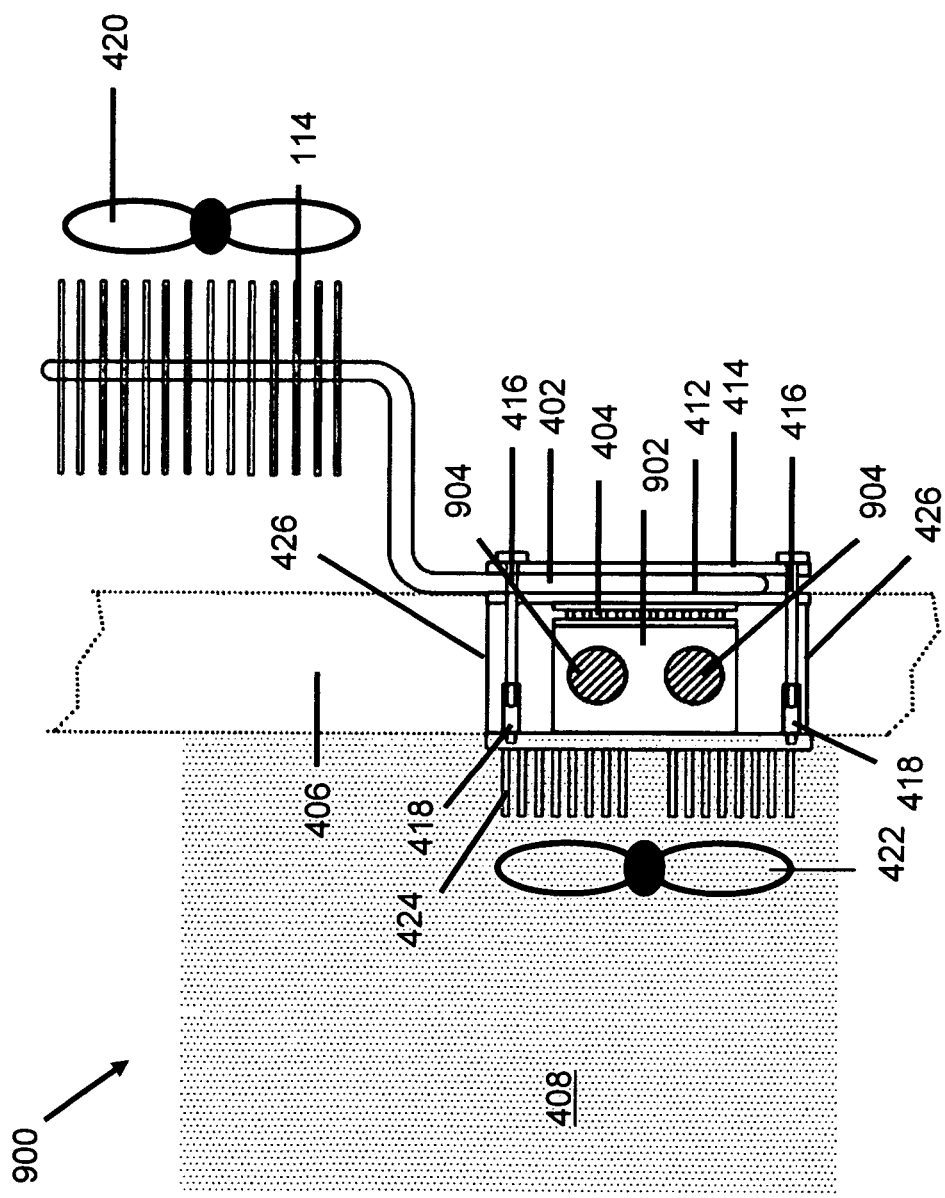
FIG. 9 illustrates a cross-sectional view of a thermoelectric cooling device, in accordance with yet another embodiment of the invention.

FIG. 9 illustrates a cross-sectional view of a thermoelectric cooling device 900, in accordance with yet another embodiment of the invention.

Thermoelectric cooling device 900 has the elements mentioned in conjunction with FIG. 4. Thermoelectric cooling device 900 contains a metal standoff 902 that has a Phase Change Material (PCM) 904 embedded in it. PCM 904 maintains the temperature of the cold side of thermoelectric device 404 within a constant temperature range.

The use of PCM 904 facilitates long-duty cycles for thermoelectric device 404, thereby increasing its efficiency. PCM 904 maintains a low temperature differential across thermoelectric device 404. Since a low temperature differential improves the efficiency, the operation of thermoelectric device 404 is more efficient in this embodiment.

In an exemplary embodiment, PCM 904 is a package of blue-ice PCM or hydrated salt based materials or ice. In another exemplary embodiment, PCM 904 is made of liquid metals. Typical examples of liquid metals used to make PCM 904 include, but are not limited to, gallium, indium and tin alloys.

Figure 10:
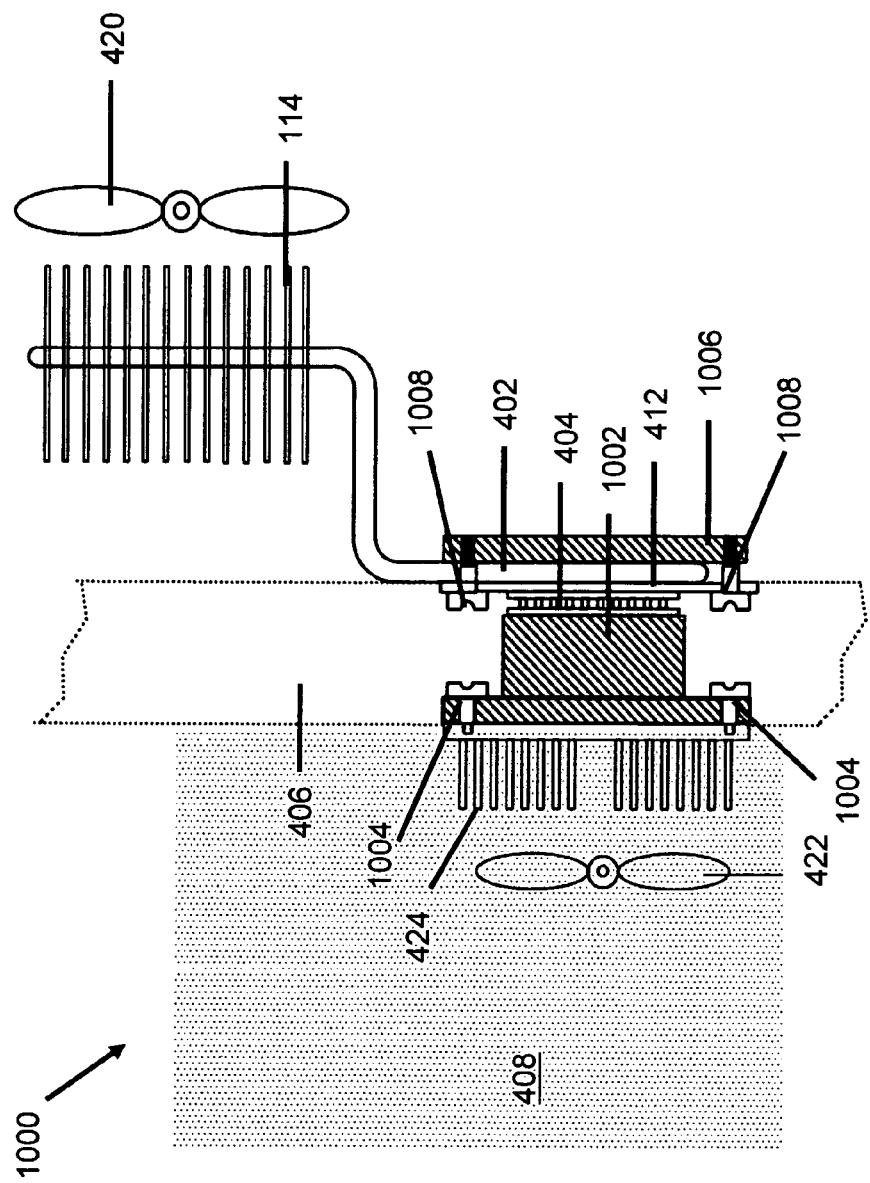
FIG. 10 illustrates a cross-sectional view of a thermoelectric cooling device, in accordance with yet another embodiment of the invention.

FIG. 10 illustrates a cross-sectional view of a thermoelectric cooling device 1000, in accordance with yet another embodiment of the invention.

Apart from the elements mentioned in conjunction with FIG. 4, thermoelectric cooling device 1000 has a magnetic standoff 1002 and a magnetic plate 1006.

Magnetic standoff 1002 is attached to the cold side of thermoelectric device 404. Further, magnetic standoff 1002 is attached to cold sink 424 through screws 1004. Magnetic plate 1006 is attached to heat pipe 402 through screws 1008.

In an embodiment of the present invention, magnetic standoff 1002 is made of a magnetic material, for example, iron or nickel. In this embodiment, magnetic plate 1006 is a magnet and is made of a material, for example, samarium cobalt or neodymium iron boron.

In another embodiment of the present invention, magnetic standoff 1002 is a magnet made of a material, for example, samarium cobalt or neodymium iron boron. In this embodiment, magnetic plate 1006 is made of a magnetic material, for example, iron or nickel.

The magnetic force generated between magnetic plate 1006 and magnetic standoff 1002 clamps heat pipe 402 and thermoelectric device 404 to magnetic standoff 1002, which is present at the cold side of thermoelectric device 404.

Since screws are not required to attach heat pipe 402 to cold sink 424 in this embodiment, no thermal leakage from the hot side of thermoelectric device 404 to the cold side of thermoelectric device 404 is possible through the screws.

Figure 11:
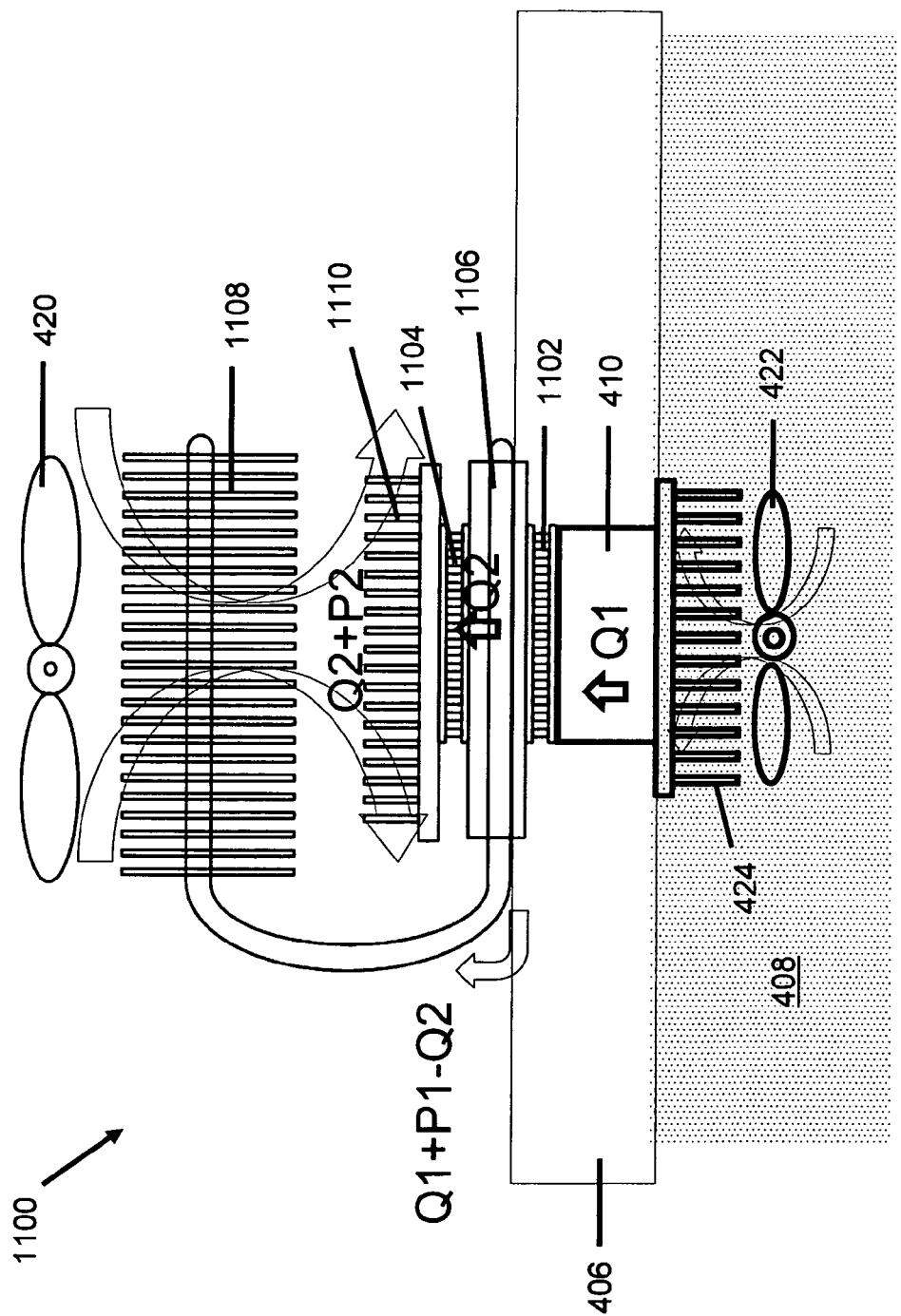
FIG. 11 illustrates a cross-sectional view of a two stage thermoelectric cooling device, in accordance with an embodiment of the invention.

FIG. 11 illustrates a cross-sectional view of a thermoelectric cooling device 1100, in accordance with an embodiment of the present invention.

Thermoelectric cooling device 1100 is a two stage thermoelectric cooler which comprises a first thermoelectric device 1102 and a second thermoelectric device 1104. First thermoelectric device 1102 and second thermoelectric device 1104 are connected to chamber 406 through one of the attachment methods mentioned in the embodiments explained in FIG. 1 to FIG. 10. The characteristic of thermoelectric cooling device 1100 is that a fraction of heat generated at the hot side of first thermoelectric device 1102 is rejected to the ambient by a first set of heat pipes 1106. The remaining fraction is extracted by second thermoelectric device 1104. This allows second thermoelectric device 1104 to be of a small size, and the temperature of the hot side of first thermoelectric cooler 1102 to be very close to that of the ambient.

One end of first set of heat pipes 1106 is connected between first thermoelectric device 1102 and second thermoelectric device 1104. The other end of first set of heat pipes 1106 is connected to the fins of common heat sink 1108. Further, a secondary heat sink 1110 is connected to second thermoelectric device 1104. Common heat sink 1108 is positioned in proximity to secondary heat sink 1110. Therefore, heat sink fan 420 creates airflow through both common heat sink 1108 and secondary heat sink 1110 as indicated by arrows.

In FIG. 11, the heat flow has been marked as:

Q1—heat extracted by first thermoelectric device 1102 from chamber 406;

P1—electrical power consumed by first thermoelectric device 1102;

Q2—heat extracted from first set of heat pipes 1106 and the hot end of first thermoelectric device 1102 by second thermoelectric device 1104; and P2—electrical Power consumed by second thermoelectric device 1104.

First thermoelectric device 1102 extracts heat (marked as Q1 in FIG. 11) from chamber 406 and rejects heat equivalent to Q1+P1 at the hot side. First set of heat pipes 1106 transfers a part (marked as Q1+P1−Q2 in FIG. 11) of this heat to common heat sink 1108. Common heat sink 1108 rejects this heat to the ambient through heat sink fan 420.

The remaining part of the heat (marked as Q2 in FIG. 11) is extracted by second thermoelectric device 1104. The air flow through secondary heat sink 1110 and common heat sink 1108 created by heat sink fan 420 dissipates this heat (marked as Q2 in FIG. 11) and the heat generated by second thermoelectric device 1104 (marked as P2 in FIG. 11) to the ambient.

Thus, first set of heat pipes 1106 lowers the heat flux through second thermoelectric device 1104. This reduces the temperature differential across second thermoelectric device 1104. The Coefficient of Performance (COP) of a thermoelectric device is inversely proportional to the temperature differential across it. Thus, in this embodiment of the present invention, the COP of second thermoelectric device 1104 is significantly enhanced.

Moreover, since some heat from first set of heat pipes 1106 (marked as Q2 in FIG. 11) is transferred to second thermoelectric device 1104, first set of heat pipes 1106 does not need to dissipate all the heat (Q1+P1) to common heat sink 1108. Hence the temperature of first set of heat pipes 1106 and that of the hot side of first thermoelectric device 1102 are low and very close to that of the ambient. This is an important advantage because first thermoelectric device 1102 can cool cold sink 424 and chamber 406 to low temperatures.

In an embodiment of the present invention, first thermoelectric device 1102 comprises a plurality of second thermoelectric devices 1104.

Figure 12:
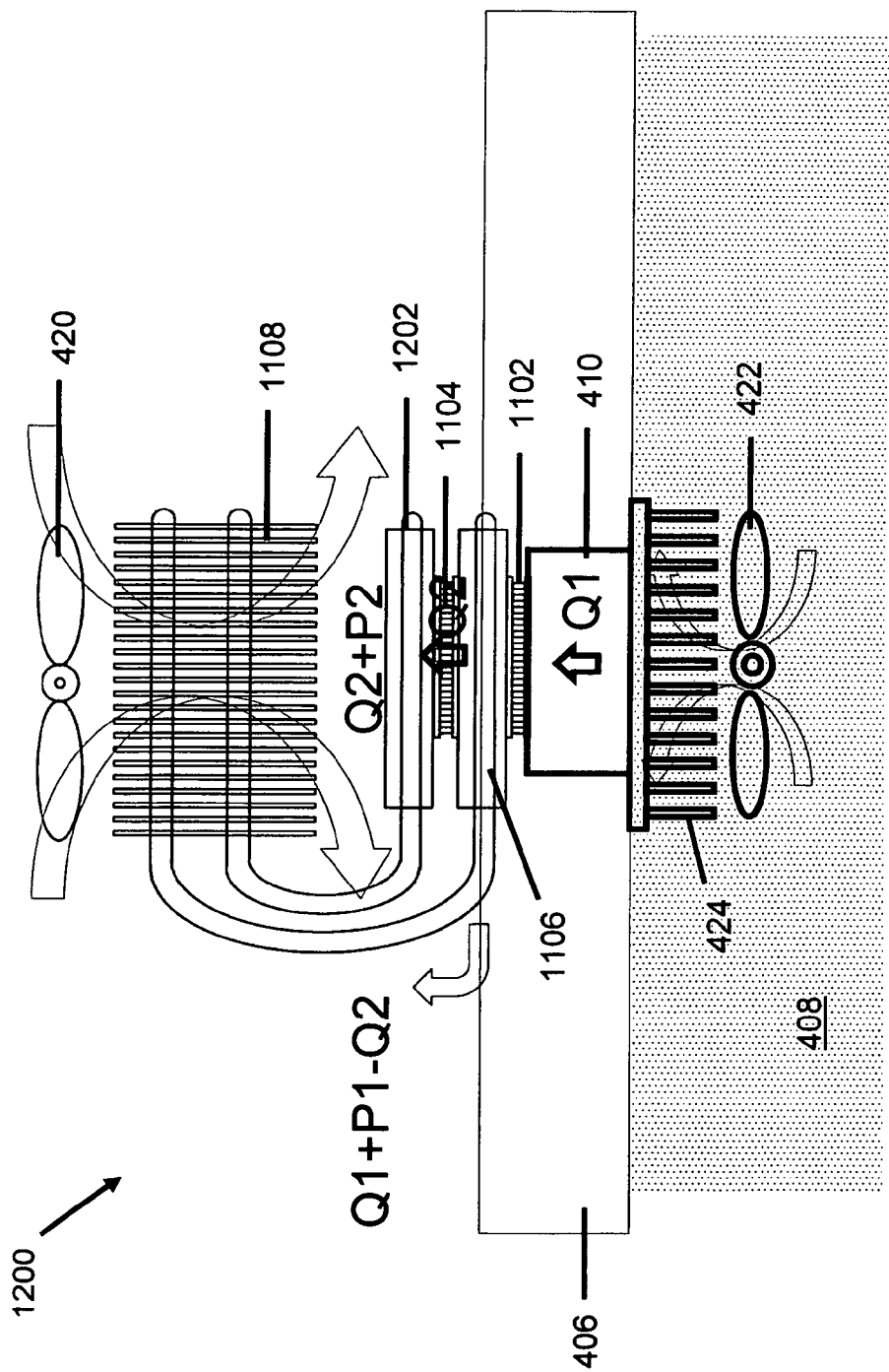
FIG. 12 illustrates a cross-sectional view of a two stage thermoelectric cooling device, in accordance with another embodiment of the invention.

FIG. 12 illustrates a cross-sectional view of a thermoelectric cooling device 1200, in accordance with another embodiment of the invention.

Thermoelectric cooling device 1200 is a two stage thermoelectric cooler similar to thermoelectric cooling device 1100. Apart from the elements mentioned in conjunction with FIG. 11, (first thermoelectric device 1102, second thermoelectric device 1104, and first set of heat pipes 1106), thermoelectric cooling device 1200 includes a second set of heat pipes 1202.

In an embodiment of the present invention, both the heat pipes 1106 and 1202 are vapor diodes.

Second set of heat pipes 1202 is connected to the hot side of second thermoelectric device 1104. In this embodiment of the present invention, both thermoelectric devices 1102 and 1104 can operate in a switching cycle. First thermoelectric device 1102 and second thermoelectric device 1104 can be switched on after a long period of inactivity when the heat leakage through the walls of chamber 406 increases the temperature of fluid 408 above an upper limit of temperature. When first thermoelectric device 1102 and second thermoelectric device 1104 are switched off, heat pipes 1106 and 1202 prevent backflow of heat to first thermoelectric device 1102 and second thermoelectric device 1104, respectively. Second set of heat pipes 1202 is connected to common heat sink 1108 and transfers the heat rejected by second thermoelectric device 1104 to common heat sink 1108.

Switching off first thermoelectric device 1102 and second thermoelectric device 1104 reduces power consumption and improves the efficiency of thermoelectric cooling device 1200.

Figure 13:
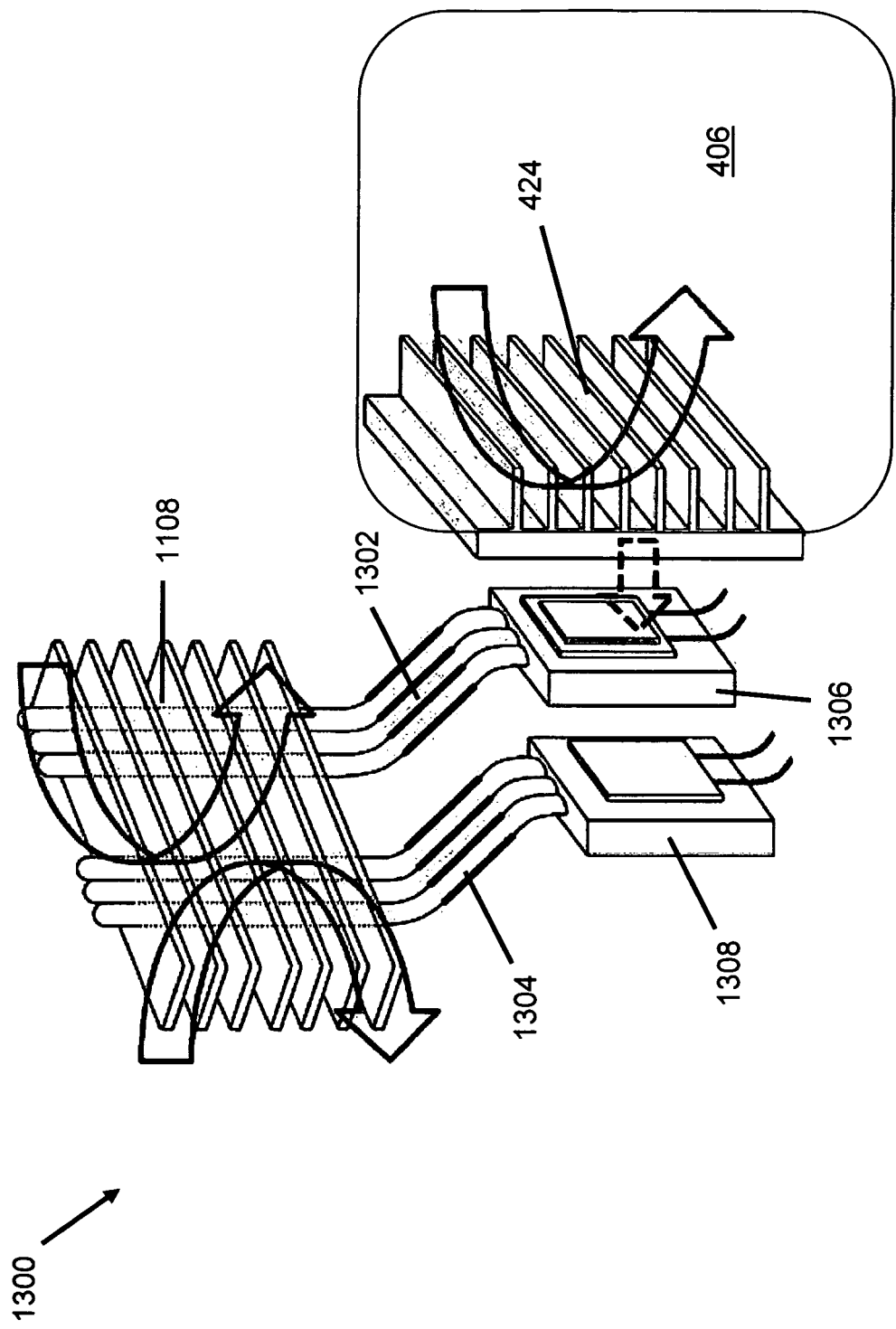
FIG. 13 illustrates an exploded view of a two stage thermoelectric cooling device, in accordance with an embodiment of the invention.

FIG. 13 illustrates an exploded view of a thermoelectric cooling device 1300, in accordance with an embodiment of the invention.

Thermoelectric cooling device 1300 is a dual thermoelectric cooler and comprises a primary thermoelectric device 1306 and a secondary thermoelectric device 1308 connected in parallel. Primary thermoelectric device 1306 has large cooling power for fast cooling and is turned on for large temperature transients. Primary thermoelectric device 1306 is turned off when the temperature of chamber 406 reaches a lower limit of temperature. Secondary thermoelectric device 1308 is turned on constantly to compensate for heat leakage into chamber 406 and maintain low temperature in chamber 406 at a steady-state. Apart from the elements mentioned in conjunction with FIG. 11, thermoelectric cooling device 1300 comprises a first multiple heat pipe 1302 and a second multiple heat pipe 1304.

In an embodiment of the present invention, first multiple heat pipe 1302 and second multiple heat pipe 1304 comprise three heat pipes 402. First multiple heat pipe 1302 and second multiple heat pipe 1304 are connected to common heat sink 1108. Airflow through common heat sink 1108 has been indicated by arrows in FIG. 13.

The use of first multiple heat pipe 1302 and second multiple heat pipe 1304 increases the cooling power and efficiency of primary thermoelectric device 1306 and secondary thermoelectric device 1308, respectively.

Figure 14:
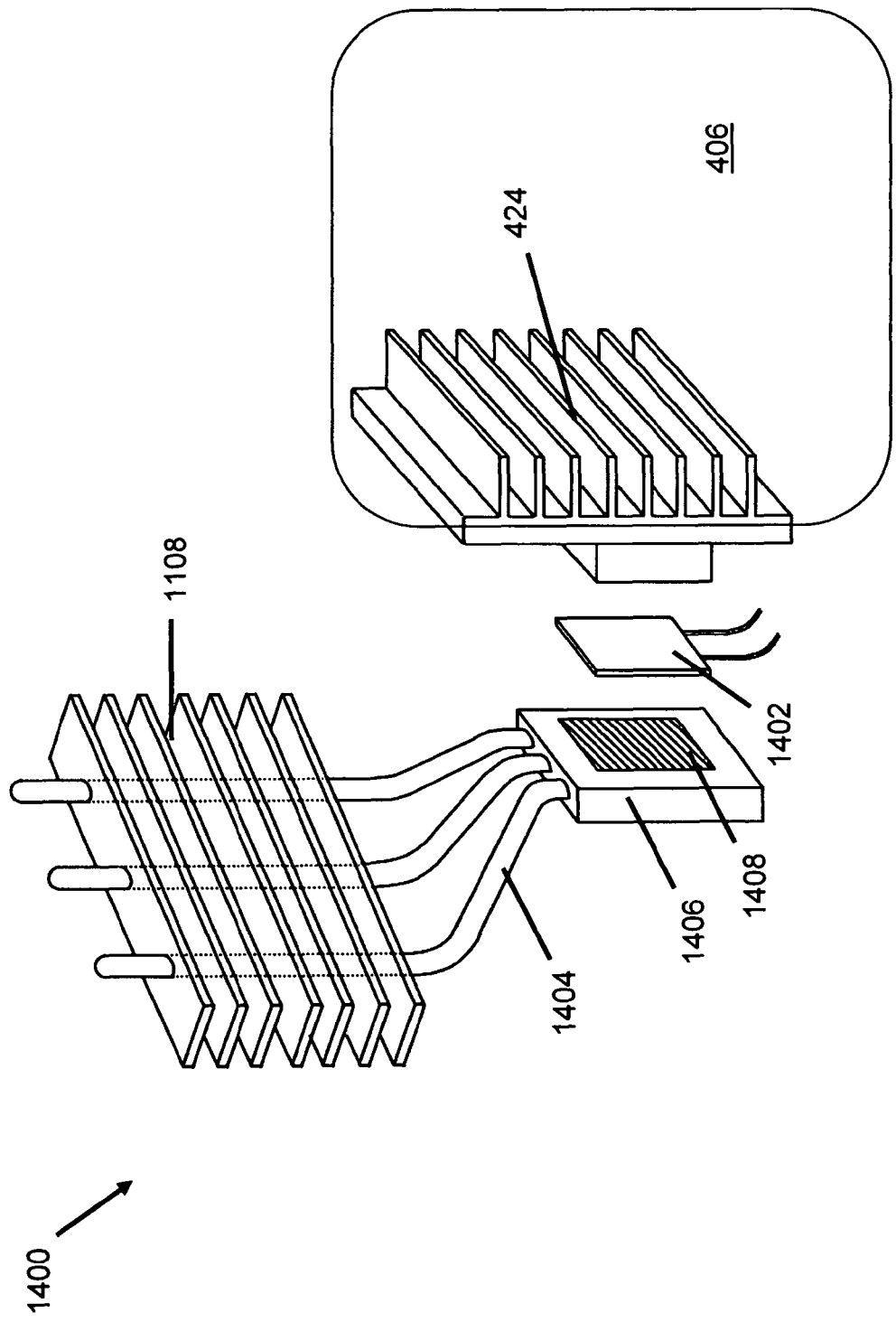
FIG. 14 illustrates an exploded view of a thermoelectric cooling device with an alternative method for attaching the thermoelectric device to a common heat sink, in accordance with an embodiment of the invention.

FIG. 14 illustrates an exploded view of a thermoelectric cooling device 1400 in accordance with an alternative attachment of a thermoelectric device 1402 to multiple heat pipes 1404, in accordance with an embodiment of the invention.

Multiple heat pipes 1404 are attached to common heat sink 1108 at one end and to an evaporating unit 1406 at the other end. Evaporating unit 1406 comprises a metal block with multiple heat pipes 1404 embedded in it. Evaporating unit 1406 ensures efficient conduction of heat from thermoelectric device 1402 to multiple heat pipes 1404.

In an alternative embodiment of the present invention, evaporating unit 1406 forms a common evaporation section of multiple heat pipes 1404. Multiple heat pipes 1404 branch out from evaporating unit 1406. Thus, multiple heat pipes 1404 have a common evaporation section, and separate insulating and condenser sections, in this embodiment.

Evaporating unit 1406 has a patch 1408 on one of its surfaces. Patch 1408 is a thermally conductive epoxy or soft solder patch to attach thermoelectric device 1402 to evaporating unit 1406. In an embodiment, the epoxy used is thermally conducting and is made of a polymeric liquid with particles of materials that include, but are not limited to, silver and boron nitride. Thermoelectric device 1402 is attached to cold sink 424 that cools fluid 408.

Figure 15:
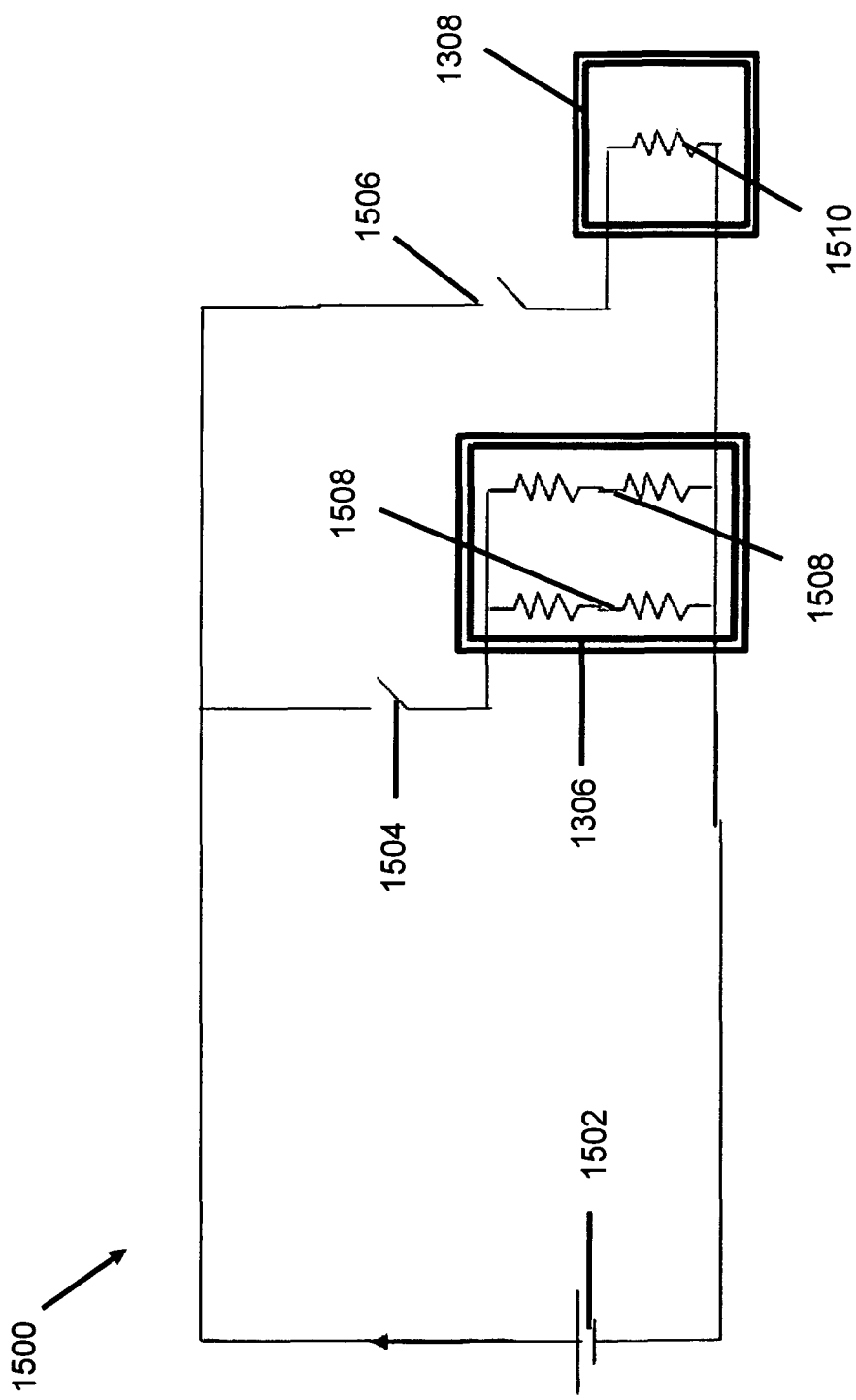
FIG. 15 illustrates a circuit for operating a two stage thermoelectric cooling device, in accordance with an embodiment of the invention.

FIG. 15 illustrates a circuit 1500 that operates a two stage thermoelectric cooling device (described in conjunction with FIG. 13), in accordance with an embodiment of the invention.

The two stage thermoelectric cooling device comprises primary thermoelectric device 1306 and secondary thermoelectric device 1308. A power source 1502 of circuit 1500 provides the power required by thermoelectric devices 1306 and 1308. Power source 1502 provides a constant voltage and is connected in parallel to primary thermoelectric device 1306 and secondary thermoelectric device 1308, and a current (marked as I in FIG. 15) flows through power source 1502 during the operation of primary thermoelectric device 1306 and secondary thermoelectric device 1308. A first switch 1504 operates primary thermoelectric device 1306 and a second switch 1506 operates secondary thermoelectric device 1308. First switch 1504 and second switch 1506 are connected to a switching circuit (not shown in FIG. 15) that operates the switches based on the temperature of fluid 408.

Secondary thermoelectric device 1308 comprises a secondary resistance 1510. Primary thermoelectric device 1306 comprises primary resistances 1508 connected in parallel. Equivalent resistance of primary resistances 1508 is equal to that of secondary resistance 1510. Hence the current through power source 1502 remains constant even when the primary thermoelectric device 1306 is switched off and the secondary thermoelectric device 1308 is switched on.

In an embodiment of the present invention, power source 1502 provides a voltage of 12 volts. A typical value of current (I) in the circuit is 4.7 amperes at this voltage. The cooling power of primary thermoelectric device 1306 is twice that of secondary thermoelectric device 1308. Secondary thermoelectric device 1308 operates at a temperature differential of $\Delta Tmax$ and primary thermoelectric device 1306 operates at a temperature differential of $0.7\Delta Tmax$. In this embodiment, secondary thermoelectric device 1308 operates at a current Imax (that flows in secondary resistance 1510) and primary thermoelectric device 1306 operates at a current Imax/2 (that flows in each of primary resistances 1508).

In various embodiments of the present invention, power source 1502 is selected from a group including, but not limited to, solar photovoltaic panel, fuel cell, wind turbine, and Lithium ion battery.

In an embodiment of the present invention, one or more of the thermoelectric cooling devices—400, 500, 600, 700, 800, 900, 1000, 1100, 1200, 1300, and 1400 are water coolers or portable coolers.

While the preferred embodiments of the invention have been illustrated and described, it will be clear that the invention is not limited to these embodiments only. Numerous modifications, changes, variations, substitutions, and equivalents will be apparent to those skilled in the art without departing from the spirit and scope of the invention.

What is claimed is:

1. A thermoelectric cooling device for cooling a fluid present in a chamber, the thermoelectric cooling device comprising:
    a thermoelectric device, the thermoelectric device cooling the fluid;
    a metal standoff connected to a cold side of the thermoelectric device, wherein the metal standoff has a geometry configured to reduce parasitic heat leakage;
    one or more heat pipes present at a hot side of the thermoelectric device, wherein the one or more heat pipes transfer heat from the hot side of the thermoelectric device;
    a heat sink connected to the one or more heat pipes, the heat sink being configured to transfer heat extracted by the thermoelectric device to ambient through the one or more heat pipes; and
    one or more plates configured to hold the one or more heat pipes to the hot side of the thermoelectric device.

2. The thermoelectric cooling device according to claim 1 further comprising one or more screws to hold the one or more heat pipes to the hot side of the thermoelectric device and the chamber.

3. The thermoelectric cooling device according to claim 2, wherein the one or more screws comprise one or more insulating standoffs or grommets.

4. The thermoelectric cooling device according to claim 1 further comprising a cold sink connected to the metal standoff, the cold sink being configured to facilitate transfer heat from the fluid to the thermoelectric device.

5. The thermoelectric cooling device according to claim 1, wherein the metal standoff geometry is bevel shaped.

6. The thermoelectric cooling device according to claim 1, wherein the metal standoff geometry has a higher cross-sectional area at its ends than at its center.

7. The thermoelectric cooling device according to claim 1, wherein the metal standoff comprises a phase change material.

8. The thermoelectric cooling device according to claim 1, wherein the metal standoff is a magnetic standoff and at least one of the one or more plates is a magnetic plate.

9. The thermoelectric cooling device according to claim 8, wherein the magnetic standoff is made of a magnetic material and the magnetic plate is a magnet.

10. The thermoelectric cooling device according to claim 8, wherein the magnetic standoff is a magnet and the magnetic plate is made of a magnetic material.

11. The thermoelectric cooling device according to claim 1, wherein at least one of the one or more heat pipes comprises a working fluid, an adiabatic section and a condenser section, and wherein the one or more heat pipes comprises an evaporation section common to at least two of the one or more heat pipes.

12. The thermoelectric cooling device according to claim 11 wherein the one or more heat pipes act as thermal diodes.

13. The thermoelectric cooling device according to claim 1, wherein spaces in the thermoelectric cooling device are filled with at least one of polyurethane foam, styrofoam and aerogel.

14. A thermoelectric cooling device for cooling a fluid, the fluid being present in a chamber, wherein the thermoelectric cooling device comprises:
    a two stage thermoelectric device to cool the fluid, the two stage thermoelectric device comprising a first thermoelectric device and a second thermoelectric device, the first thermoelectric device and the second thermoelectric device being thermally connected;
    a metal standoff connected to a cold side of the first thermoelectric device; and
    a first set of heat pipes, wherein the first set of heat pipes is configured to remove heat from the two stage thermoelectric device, and wherein the first set of heat pipes is present between the first thermoelectric device and the second thermoelectric device.

15. The thermoelectric cooling device according to claim 14 further comprising a common heat sink attached to the first set of heat pipes, wherein the common heat sink is configured to transfer heat from the first set of heat pipes to ambient.

16. The thermoelectric cooling device according to claim 14 further comprising a secondary heat sink attached to a hot side of the second thermoelectric device, wherein the secondary heat sink is configured to transfer heat from the second thermoelectric device to ambient.

17. The thermoelectric cooling device according to claim 14 further comprising a second set of heat pipes connected to a hot side of the second thermoelectric device, wherein the second set of heat pipes is configured to remove heat from the hot side of the second thermoelectric device and to act as thermal diodes.

18. The thermoelectric cooling device according to claim 17 further comprising a common heat sink attached to the second set of heat pipes, wherein the common heat sink is configured to transfer heat from the second set of heat pipes to ambient.

19. The thermoelectric cooling device according to claim 14 further comprising a switching circuit to operate the first thermoelectric device and the second thermoelectric device.

20. The thermoelectric cooling device according to claim 14 further comprising a heat sink fan configured to dissipate heat ejected by a common heat sink and a secondary heat sink to ambient.

21. The thermoelectric cooling device according to claim 14, wherein cooling power of the first thermoelectric device is more than cooling power of the second thermoelectric device.

22. The thermoelectric cooling device according to claim 14, wherein the first thermoelectric device and the second thermoelectric device are thermally connected in series.

23. The thermoelectric cooling device according to claim 14, wherein the first thermoelectric device and the second thermoelectric device are thermally connected in parallel.

24. The thermoelectric cooling device according to claim 14, wherein the first thermoelectric device comprises a plurality of the second thermoelectric devices.

25. The thermoelectric cooling device according to claim 1, wherein the chamber is a refrigerator.

26. The thermoelectric cooling device according to claim 25, wherein spaces in the thermoelectric cooling device are filled with at least one of polyurethane foam, styrofoam and aerogel.

27. The thermoelectric cooling device according to claim 14, wherein the chamber is a refrigerator.

28. A thermoelectric cooling device for cooling a fluid present in a chamber, the thermoelectric cooling device comprising:
    a thermoelectric device, the thermoelectric device cooling the fluid;
    a metal standoff connected to a cold side of the thermoelectric device, wherein the metal standoff is a magnetic standoff and at least one of the one or more plates is a magnetic plate;
    one or more heatpipes present at a hot side of the thermoelectric device, wherein the one or more heat pipes transfer heat from the hot side of the thermoelectric device;
    a heat sink connected to the one or more heat pipes, the heat sink being configured to transfer heat extracted by the thermoelectric device to ambient through the one or more heat pipes; and
    one or more plates configured to hold the one or more heat pipes to the hot side of the thermoelectric device.

29. The thermoelectric cooling device according to claim 28 further comprising a cold sink connected to the metal standoff, the cold sink being configured to facilitate transfer heat from the fluid to the thermoelectric device.

30. The thermoelectric cooling device according to claim 28, wherein the magnetic standoff is made of one of a magnetic material and a magnet, and the magnetic plate is made of the other of the magnetic material and the magnet.

31. The thermoelectric cooling device according to claim 28, wherein at least one of the one or more heat pipes comprises a working fluid, an adiabatic section and a condenser section, and wherein the one or more heat pipes comprises an evaporation section common to at least two of the one or more heat pipes.

32. The thermoelectric cooling device according to claim 30 wherein the one or more heat pipes act as thermal diodes.

33. A thermoelectric cooling device for cooling a fluid, the fluid being present in a chamber, wherein the thermoelectric cooling device comprises:
    a two stage thermoelectric device to cool the fluid, the two stage thermoelectric device comprising a first thermoelectric device and a second thermoelectric device, the first thermoelectric device and the second thermoelectric device being thermally connected;
    a metal standoff connected to a cold side of the first thermoelectric device;
    a first set of heat pipes, wherein the first set of heat pipes is configured to remove heat from the two stage thermoelectric device; and
    a second set of heat pipes connected to a hot side of the second thermoelectric device, wherein the second set of heat pipes is configured to remove heat from the hot side of the second thermoelectric device and to act as thermal diodes.

34. The thermoelectric cooling device according to claim 33, wherein the first set of heat pipes is present between the first thermoelectric device and the second thermoelectric device.

35. The thermoelectric cooling device according to claim 33 further comprising a common heat sink attached to the first set of heat pipes, wherein the common heat sink is configured to transfer heat from the first set of heat pipes to ambient.

36. The thermoelectric cooling device according to claim 33 further comprising a secondary heat sink attached to a hot side of the second thermoelectric device, wherein the secondary heat sink is configured to transfer heat from the second thermoelectric device to ambient.

37. The thermoelectric cooling device according to claim 33 further comprising a second set of heat pipes connected to a hot side of the second thermoelectric device, wherein the second set of heat pipes is configured to remove heat from the hot side of the second thermoelectric device and to act as thermal diodes.

38. The thermoelectric cooling device according to claim 33 further comprising a common heat sink attached to the second set of heat pipes, wherein the common heat sink is configured to transfer heat from the second set of heat pipes to ambient.

39. The thermoelectric cooling device according to claim 33 further comprising a switching circuit to operate the first thermoelectric device and the second thermoelectric device.

40. The thermoelectric cooling device according to claim 33 further comprising a heat sink fan configured to dissipate heat ejected by a common heat sink and a secondary heat sink to ambient.

41. The thermoelectric cooling device according to claim 33, wherein cooling power of the first thermoelectric device is more than cooling power of the second thermoelectric device.

42. The thermoelectric cooling device according to claim 33, wherein the first thermoelectric device and the second thermoelectric device are thermally connected in series.

43. The thermoelectric cooling device according to claim 33, wherein the first thermoelectric device and the second thermoelectric device are thermally connected in parallel.

44. The thermoelectric cooling device according to claim 33, wherein the first thermoelectric device comprises a plurality of the second thermoelectric devices.

* * * * *